(12) United States Patent
Matsuoka et al.

(10) Patent No.: US 6,558,233 B1
(45) Date of Patent: May 6, 2003

(54) WAFER POLISHING METHOD, WAFER CLEANING METHOD AND WAFER PROTECTIVE FILM

(75) Inventors: Takashi Matsuoka, Gunma (JP); Naotaka Toyama, Gunma (JP); Hideki Munakata, Fukushima (JP); Hisashi Masumura, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/719,564

(22) PCT Filed: Apr. 7, 2000

(86) PCT No.: PCT/JP00/02271

§ 371 (c)(1),
(2), (4) Date: Dec. 28, 2000

(87) PCT Pub. No.: WO00/67305

PCT Pub. Date: Nov. 9, 2000

(30) Foreign Application Priority Data

Apr. 30, 1999 (JP) .............................................. 11-123653

(51) Int. Cl.[7] ................................................. B24B 1/00
(52) U.S. Cl. ............................. 451/41; 451/53; 451/56; 451/287; 451/288
(58) Field of Search ........................ 457/53, 41, 54–56, 457/63, 285, 287, 289; 430/5; 134/1

(56) References Cited

U.S. PATENT DOCUMENTS

| | | | |
|---|---|---|---|
| 5,601,732 A | | 2/1997 | Yoshida |
| 6,234,873 B1 | * | 5/2001 | Yamamoto et al. ............ 451/41 |
| 6,251,542 B1 | * | 6/2001 | Tomita et al. .................. 430/5 |
| 6,290,777 B1 | * | 9/2001 | Imaoka et al. ................. 134/1 |
| 6,299,516 B1 | * | 10/2001 | Tolles ........................ 451/287 |

OTHER PUBLICATIONS

Abstract of Japanese Patent Publ. No. 62051226A; dated Mar. 5, 1987.
Abstract of Japanese Patent Publ. No. 04181730A; dated Jun. 29, 1992.
Abstract of Japanese Patent Publ. No. 06267654A; dated Sep. 22, 1994.
Abstract of Japanese Patent Publ. No. 10120965A; dated May 12, 1998.
Abstract of Japanese Patent Publ. No. 08148452A; dated Jun. 7, 1996.

* cited by examiner

*Primary Examiner*—Lee Wilson
(74) *Attorney, Agent, or Firm*—Arent Fox Kintner Plotkin & Kahn, PLLC

(57) ABSTRACT

Provided are a wafer polishing method in which, in single side polishing, covering a wafer holding surface (one side surface) with a protective film, a wafer polishing surface (the other side surface) is polished, so that the wafer holding surface can be prevented from being etched and contaminated by a polishing agent; a wafer cleaning method in which the protective film that remains behind on the wafer holding surface after polishing can be efficiently removed, and a waste cleaning solution is easily treated; and a wafer protective film that sufficiently covers the wafer holding surface in polishing but is effectively removed in cleaning. In a wafer polishing method in which a wafer holding surface of one side surface of a wafer is held and a wafer polishing surface of the other side surface thereof is polished while dripping a polishing agent, the wafer polishing surface is polished while covering the wafer holding surface with a synthetic resin protective film of etching resistance against the polishing agent, good adhesiveness to the wafer and a property easy to peel off from the wafer after polishing.

13 Claims, 3 Drawing Sheets

WAFER POLISHING METHOD, WAFER CLEANING METHOD AND WAFER PROTECTIVE FILM

TECHNICAL FIELD

This invention relates to a polishing method for a thin plate substrate (hereinafter referred to as a wafer) such as a liquid crystal substrate or a semiconductor substrate, a cleaning method for a wafer, and a protective film for a wafer.

BACKGROUND ART

Conventionally, there is a single side polishing method for a wafer wherein a wafer holding surface of one side surface of the wafer is held on a wafer holder, and a wafer polishing surface of the other side surface thereof is pushed onto a turn table under a pressure, while dripping a polishing agent, thereby polishing the wafer polishing surface. In this single side polishing method for a wafer, the polishing operation is performed without protection of the wafer holding surface. Further, there is known a cleaning method in which a wafer is cleaned with an alkaline solution to remove a polishing agent and others used in wafer polishing.

In the conventional single side polishing method, there is a problem that a wafer holding surface is etched or contaminated by a polishing agent because the wafer is polished without protection of the wafer holding surface.

With the foregoing problem of the prior art in view, it is an object of the present invention to provide a wafer polishing method in which, in single side polishing, covering a wafer holding surface (one side surface) of a wafer with a protective film, a wafer polishing surface (the other side surface) thereof is polished, so that the wafer holding surface can be prevented from being etched and contaminated by a polishing agent; a wafer cleaning method in which the protective film that remains behind on the wafer holding surface after polishing can be efficiently removed, and a waste cleaning solution is easily treated; and a wafer protective film that sufficiently covers the wafer holding surface in polishing but is effectively removed in cleaning.

DISCLOSURE OF THE INVENTION

In order to solve the above problem, a wafer polishing method of the invention in which a wafer holding surface of one side surface of a wafer is held and a wafer polishing surface of the other side surface thereof is polished while dripping a polishing agent, is characterized in that the wafer polishing surface is polished while covering the wafer holding surface with a synthetic resin protective film of etching resistance against the polishing agent, good adhesiveness to the wafer and a property easy to peel off from the wafer after polishing. As the synthetic resin protective film, polyvinyl butyral (PVB) resin is preferable.

PVB resin is known as a kind of polyvinyl acetal resin. A polymerization degree of PVB resin is preferably in the range of from about 300 to about 1000. Considering uniformity of the resin on the wafer surface and flatness of the wafer after polishing, a thickness of the protective film is preferably in the range of from 70 nm to 500 nm.

The above described PVB resin protective film is formed on the wafer holding surface under a procedure in which a solution containing PVB resin dissolved in isopropyl alcohol (IPA) is coated on the wafer holding surface, followed by heat treatment. As a coating method, spin coating is preferably employed. PVB resin and an IPA solution are preferably of high purity with a low content of impurities.

A PVB resin concentration in the IPA solution is preferably in the range of from 0.2 wt % to 5.0 wt %. The heat treatment is preferably performed under conditions of a temperature in the range of from 50° C. to 200° C. and a time in the range of from 30 seconds to 720 seconds. If the temperature is 50° C. or lower, a protective film relatively easy to peel off is formed, while if the temperature is 200° C. or higher, a protective film relatively hard to peel off is formed. Further, if a time of treatment is short, a film easy to peel off is readily formed, while if the time is long, the film hard to peel off is readily formed. Therefore, at a heat treatment temperature in the range of from 50° C. to 200° C., there can be formed a PVB resin protective film having a favorable performance hard to peel off during polishing but easy to be removed by cleaning.

The PVB resin has advantages that it is easily available because of its low price in comparison with other resin, and a highly flat wafer is obtainable because a film thickness is controllable by adjusting an amount of PVB resin dissolved in IPA. A PVB resin protective film is excellent in chemical resistance and surface hardness, and good in adhesiveness to glass and metal, so particularly suitable for a protective film.

A wafer cleaning method of the present invention is to clean a wafer already polished by the above described wafer polishing method, comprises: the first cleaning step of cleaning the polished wafer with ozone gas dissolved water; and the second cleaning step of cleaning the wafer already cleaned with the ozone gas dissolved water using an alkaline solution, wherein the polishing agent and the synthetic resin protective film are cleaned and removed from the polished wafer.

An ozone concentration in the ozone gas dissolved water is properly 10 ppm or higher and water into which fresh ozone gas is dissolved is constantly supplied.

Two ways are available for cleaning a wafer with the ozone gas dissolved water: one is to jet the cleaning water to the wafer, and the other is to immerse the wafer in the cleaning water.

In the alkaline cleaning, aqueous ammonia/hydrogen peroxide solution cleaning is preferably adopted, but NaOH/$H_2O_2$ and the like can also be employed. However, using ammonia water or NaOH only, a wafer surface becomes rough, so an alkaline solution containing hydrogen peroxide is employed.

Brush cleaning in combination with the alkaline cleaning can further increase a cleaning efficiency.

Using cleaning with ozone gas dissolved water only, it takes a long time to remove perfectly a synthetic resin protective film covering a wafer. However, the synthetic resin protective film can be easily removed by cleaning the wafer with ozone gas dissolved water for a short time (several minutes), followed by cleaning with an alkaline solution.

Cleaning with an alkaline solution is desirably cleaning with a heated aqueous ammonia/hydrogen peroxide solution (SC-1). After cleaning with the alkaline solution, the wafer is rinsed with pure water and dried, while the pure water rinsing followed by brush cleaning increases a power of removing the PVB protective film. The brush cleaning is especially effective for removal of the PVB protective film spreading onto the edge surface of the wafer.

For the brush cleaning, it is preferable to employ brush cleaning with a heated aqueous ammonia/hydrogen peroxide solution. Cleaning with an alkaline solution can dissolve and remove a synthetic resin protective film decomposed in cleaning with ozone gas dissolved water. For dissolution and removal of a synthetic resin protective film with an alkaline solution, cleaning with ozone gas dissolved water plays an important role wherein the higher an ozone concentration, the easier the dissolution of the synthetic resin protective film in the alkaline solution cleaning. Further, the longer a time consumed in cleaning with ozone dissolved wafer, the easier the dissolution and removal of the synthetic resin protective film. If cleaning with ozone gas dissolved water is not applied but only cleaning with an alkaline solution is applied, there arises a problem that the synthetic resin protective film is peeled off into filmy pieces which contaminate the cleaning solution or reattach onto the wafer.

It has been known that PVB can be removed with organic solvent or the like. The use of organic solvent, however, gives rise to trouble in waste liquid treatment, that is, an environmental aspect. In a wafer cleaning method of the present invention, ozone gas dissolved water and an alkaline solution are employed, making the waste liquid treatment easy.

A wafer treatment method of the present invention comprises: a step of polishing a wafer polishing surface of a wafer while holding a wafer holding surface thereof by the above described wafer polishing method; and a step of cleaning the polished wafer to remove a polishing agent and a synthetic resin protective film from the wafer by the above described wafer cleaning method.

The first wafer protective film of the present invention is formed on a wafer holding surface of a wafer with a synthetic resin of etching resistance against a polishing agent used in polishing the wafer, good adhesiveness to the wafer and a property easy to peel off from the wafer after polishing.

The second wafer protective film of the present invention is coated on the wafer holding surface in the above described wafer polishing method, and removed from the wafer holding surface by the above described wafer cleaning method.

Function

According to a wafer polishing method of the present invention, coating specific synthetic resin, preferably PVB resin, on a wafer holding surface, a wafer polishing surface is polished, so that the wafer holding surface can be protected from a polishing agent. In a wafer cleaning method of the present invention, a wafer, a holding surface of which is coated with synthetic resin, for example, a PVB protective film, and a polishing surface of which is polished, is cleaned with ozone gas dissolved water, so that the synthetic resin, for example, the PVB protective film, can be dissolved and removed using an alkaline solution.

Further, according to a wafer cleaning method of the present invention, an oxide film is formed on a surface of a wafer polished with ozone gas dissolved water, and a polishing agent and the like can be removed together with synthetic resin, for example, a PVB protective film with an alkaline solution. Removal of synthetic resin, for example, a PVB protective film with ozone gas dissolved water and an alkaline solution can be performed more easily than removal with aqueous sulfuric acid/hydrogen peroxide solution or organic solvent. Also, the treatment with ozone dissolved water and an alkaline solution is advantageously ecology-friendlier than treatment with a strong acid and organic solvent.

BEST MODE FOR CARRYING OUT THE INVENTION

Figure 1:
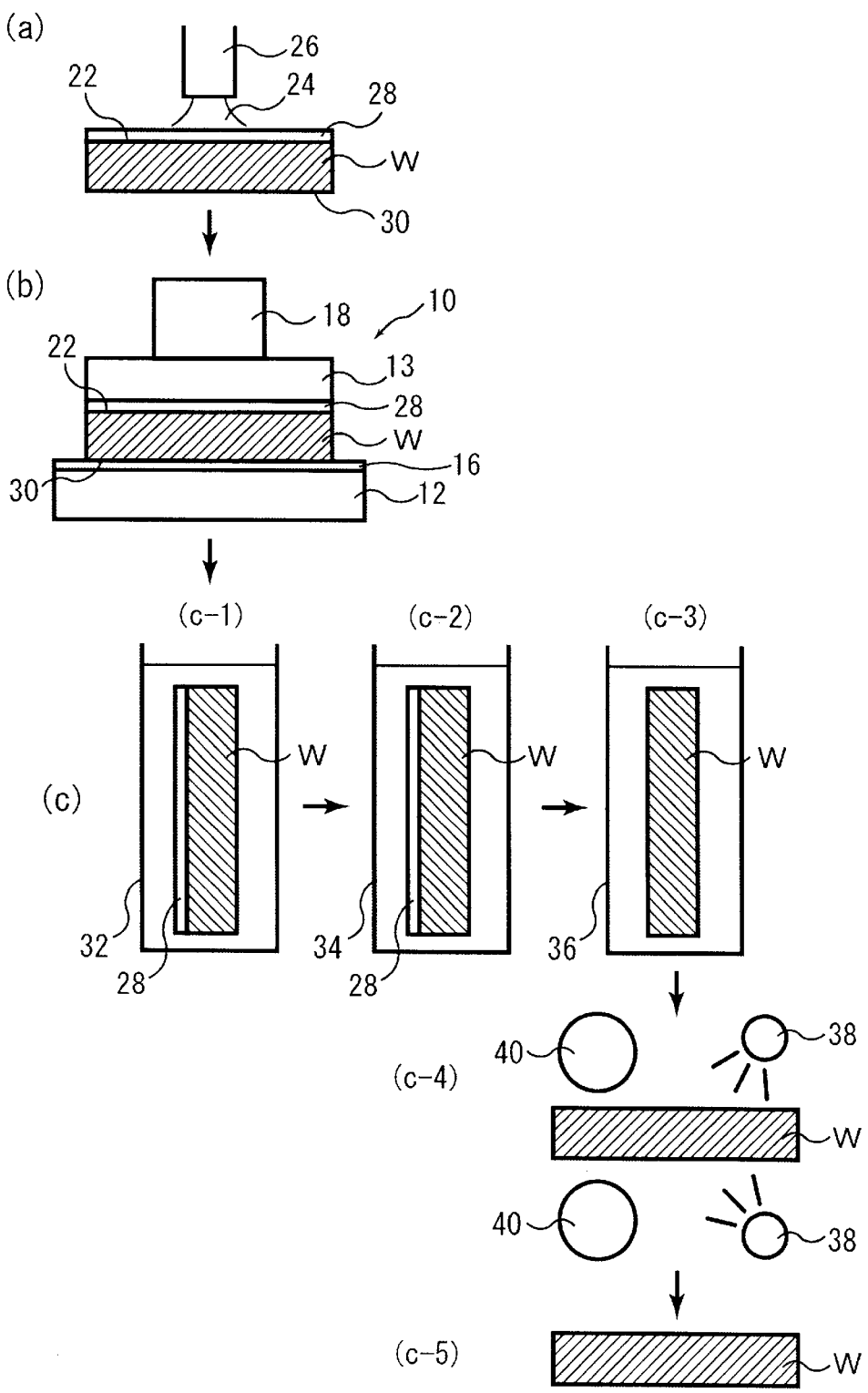
FIG. 1 is a schematic flow diagram of a process of the present invention.

Description will be given of an embodiment of the invention below based on the accompanying drawings. It should be understood that the invention is not limited to any of descriptions in the examples shown in the drawings, but rather, needless to say, that various modifications and alterations thereof may be possible without departing from the inventive idea of the invention.

Figure 2:
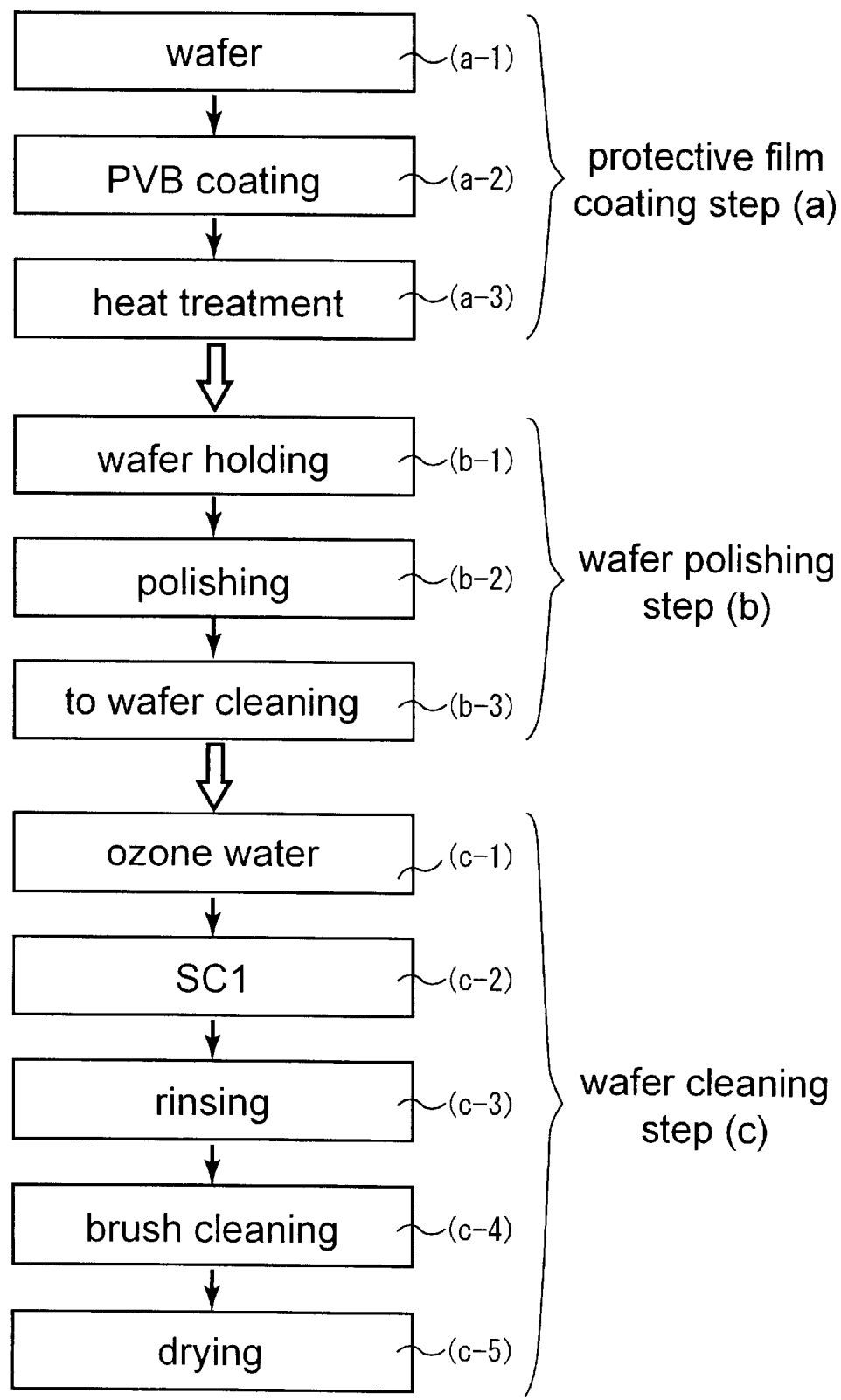
FIG. 2 is a block diagram showing steps of a process of the present invention.
Figure 3:
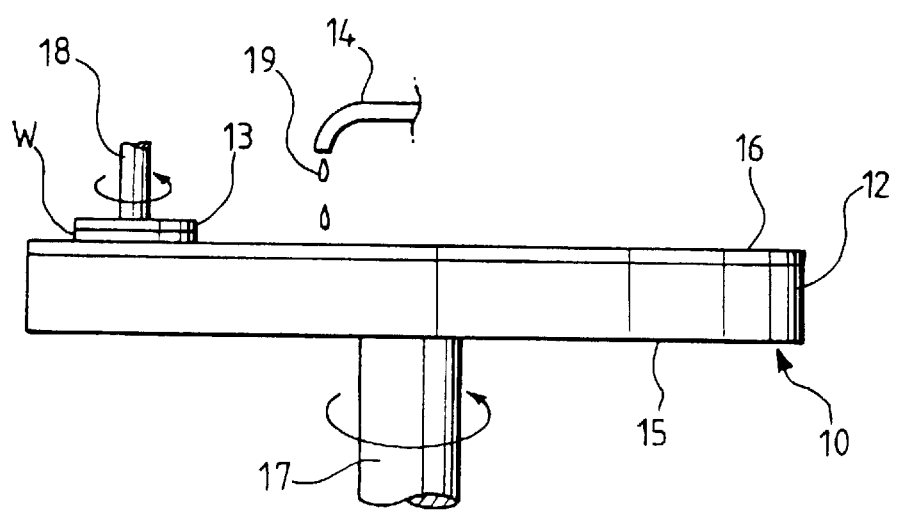
FIG. 3 is a side view showing an example of a single-side wafer polishing apparatus of the present invention.

FIG. 1 and FIG. 2 show a process of a wafer treatment method of the invention. FIG. 1 is a schematic flow diagram of a process of the invention and FIG. 2 is a flow chart showing steps of a process of the invention. FIG. 3 is a side view showing an example of a single-side wafer polishing apparatus.

In FIG. 3, a polishing apparatus 10 comprises a turn table 12, a wafer holder 13 and a polishing agent supplying device 14. The turn table 12 comprises a turn table body 15 and a polishing pad 16 adhered on the upper surface of the turn table body 15. The turn table 12 is rotated on a rotary shaft 17 at a predetermined rotation speed.

The wafer holder 13 holds a wafer W on the lower surface thereof with a vacuum chucking or the like and pushes the wafer W onto the polishing pad 16 under a predetermined load concurrently with rotation on the rotary shaft 18. The polishing agent supplying device 14 supplies a polishing agent 19 onto the polishing pad 16 at a predetermined flow rate and the polishing agent 19 is supplied between the wafer W and the polishing pad 16, thereby the wafer W being polished.

A wafer treatment method of the invention, as shown in FIGS. 1 and 2, includes: a protective film coating step (a) of coating synthetic resin, for example, PVB resin, a wafer polishing step (b) and a wafer cleaning step(c).

In the protective film coating step (a), a wafer W is provided (a-1), a solution 24 containing synthetic resin, for example, PVB resin, dissolved in IPA is coated on a wafer holding surface 22 of one side surface of the wafer W with a coating means, such as a spin-coating means 26 (a-2), and heat treatment is applied to the wafer W, for example, at a temperature in the range of from 50° C. to 200° C. for a time in the range of from 30 seconds to 720 seconds to form a protective film 28 of PVB resin (a-3). The other side surface of the wafer W is a polishing surface 30 to be polished with a polishing apparatus.

Next, in the wafer polishing step (b), for example, using the polishing apparatus 10 shown in FIG. 3, the wafer W is polished. At this time, there is held on the wafer holder 13 the wafer holding surface 22 of the wafer W coated with the PVB resin protective film 28 (b-1). Then, the polishing surface 30 is pushed on a surface of the polishing pad 16 on the turn table 12 under pressure and polished while dripping a polishing agent 19(b-2). Thus polished wafer W is transported to the wafer cleaning step (c) (b-3).

The wafer cleaning step (c) includes: an ozone water cleaning section (c-1); an alkaline cleaning section (c-2); a rinsing section (c-3); a brush cleaning section (c-4); and a drying section (c-5).

In the ozone water cleaning section (c-1), a polished wafer W is immersed in an over-flow cleaning tank 32 filled with ozone gas dissolved water. Following this, in the alkaline cleaning section (c-2), the wafer W is immersed in a cleaning tank 34 filled with aqueous ammonia/hydrogen peroxide solution. The wafer W is then rinsed in a rinsing tank 36 in the rinsing section (c-3) and thereafter, transported to the brush cleaning section (c-4) by a transport robot or the like. In the section, both surfaces and the edge surface of the wafer W are brush-cleaned by brush means 40, 40 while jetting an aqueous ammonia/hydrogen peroxide solution from shower means 38, 38, followed by jetting pure water to perform rinse brush cleaning. The synthetic resin protective film, such as the PVB resin protective film 28 is removed in the wafer cleaning step (c). Finally, in the drying section (c-5), the wafer W is spin-dried.

The invention will further be detailed taking up examples below. It is needless to say that the examples are shown illustrative and should not be construed in a restrictive way.

EXAMPLE 1

A sample wafer (a silicon wafer of a p-type and 8 inches in diameter) was processed according to the steps shown in FIG. 1 and FIG. 2.

In the protective film coating step (a), 6 to 7 ml of an IPA solution containing dissolved PVB resin (a polymerization degree of 1000 and a butyralization degree of 71 mol %) at a PVB resin concentration of 2.5 wt % was spin-coated on one side surface of the sample wafer, followed by heat treatment to form a protective film. After formation of the protective film, the wafer was transported to the polishing step (b) by a transport robot.

In the polishing step (b), holding the protective film surface of the sample wafer, one side surface of the sample wafer was polished while dripping a polishing agent (a colloidal silica polishing agent of pH=10.5). After completion of the polishing, the wafer was transported to a cleaning tank filled with ozone gas dissolved water in the cleaning step (c).

In the cleaning step (c), the sample wafer was immersed in the over-flow tank filled with ozone gas dissolved water (an ozone concentration of 45 ppm) for 4 minutes. Thereafter, the sample wafer was further immersed in a cleaning tank filled with an aqueous ammonia/hydrogen peroxide solution (SC-1, ammonia water hydrogen peroxide water:water=1:1:10) at 80° C. for 4 minutes. Then, the sample wafer is transported to the brush cleaning section by the transport robot to brush-clean both surfaces and the edge surface of the sample wafer while jetting in the state of a shower the aqueous ammonia/hydrogen peroxide solution (SC-1, ammonia water:hydrogen peroxide water:water= 1:1:10). After that, the sample wafer was further brush-cleaned, while jetting pure water for rinsing. In the drying section, the sample wafer was spin-dried.

In the above described wafer treatment, since the wafer holding surface was protected by the synthetic resin protective film during the polishing operation, neither etching nor contamination of the wafer holding surface by the polishing agent was recognized. The number of particles on the sample wafer after the cleaning was at the same level as that on a wafer with no protective film. Further, no residue of the PVB protective film was recognized on the wafer.

COMPARATIVE EXAMPLE 1

A protective film is formed in a similar manner of Example 1 with the exception that styrene resin, amide resin or epoxy resin was employed instead of PVB and one side surface of a sample wafer was polished. Of these resins, there were some which can not form a protective film from the beginning or can not protect the holding surface because a protective film was peeled off during the polishing. Further, the epoxy resin had excellent adhesiveness to a wafer, but it is so hard to peel off the resin from the wafer after the polishing that this resin was impractical.

Thus, a protective film requires good adhesiveness to a wafer when forming the film as well as during polishing, uniformity all over the surface of the wafer, and a property hard to peel off. Besides, it is important for the film to have etching resistance against a polishing agent used in the polishing. As an excellent protective film of the above-noted characteristics, PVB may be named.

COMPARATIVE EXAMPLE 2

In the cleaning step (c), a sample wafer was treated in a similar manner of Example 1 with the exception that the wafer was cleaned with an aqueous ammonia/hydrogen peroxide solution but no use of ozone gas dissolved water. The PVB protective film was not dissolved but peeled off into filmy pieces from the sample wafer to contaminate the inside of the cleaning tank.

That is, it was recognized the following facts: When using PVB, it is hard to peel off the protective film only by cleaning with an aqueous ammonia/hydrogen peroxide solution (SC-1 cleaning), but if the wafer was previously treated with ozone dissolved wafer, it was easy to peel off the film (a cleaning time was shortened and the film was clearly peeled off). Also, the waste liquid was easily treated.

It is found that PVB can be used as a protective film having etching resistance against a polishing agent, good adhesiveness to a wafer and a property easy to peel off after polishing.

Further, PVB is a general use material for an adhesive film employed as a laminated glass intermediate film, very low in cost, and a very preferable protective film on reduction in production cost.

Capability of Expliitation in Industry

As described above, according to the present invention, it is possible to achieve a great effect that in a polishing step a wafer holding surface can be protected from a polishing agent, and in a cleaning step the polishing agent, other contamination and synthetic resin, for example, a PVB protective film, can be sufficiently removed, thereby a high quality wafer being obtained. Also, where PVB is selected as synthetic resin, PVB is very low in cost, so there accrues a large economic merit.

What is claimed is:

1. A method of polishing a wafer in which a wafer holding surface of the wafer is held and a wafer polishing surface of the wafer opposite the wafer holding surface is polished by polishing agent dripped thereon, the method comprising the step of polishing the wafer polishing surface while covering the wafer holding surface with a synthetic resin protective film which has etching resistance against the polishing agent, good adhesiveness to the wafer and a property easy to peel off from the wafer after polishing.

2. The method according to claim 1, wherein the synthetic resin protective film is polyvinyl butyral resin.

3. The method according to claim 2, comprising the further steps of forming the polyvinyl butyral resin protective film on the wafer holding surface by dissolving a solution containing polyvinyl butyral resin in isopropyl alcohol and then heat treating the wafer.

4. The method according to claim 3, wherein a concentration of the polyvinyl butyral resin in the isopropyl alcohol solution is in the range of 0.2 wt % to 5.0 wt %.

5. The method according to claim 4, wherein the heat treatment is performed in a temperature range of 50° C. to 200° C. and a time range of 30 seconds to 720 seconds.

6. The method according to claim 3, wherein the heat treatment is performed in a temperature range between 50° C. and 200° C. and a time range of 30 seconds to 720 seconds.

7. The method according to claim 1, comprising the further steps of cleaning the polished wafer with ozone gas dissolved water; and then cleaning the wafer using an alkaline solution, wherein the polishing agent and the synthetic resin protective film are cleaned and removed from the polished wafer.

8. The method according to claim 7, wherein an ozone concentration in the ozone gas dissolved water is greater than or equal to 10 ppm.

9. The method according to claim 8, wherein the step of cleaning the wafer with the ozone gas dissolved water is effected by either one of jetting the cleaning water to the wafer and immersing the wafer in the cleaning water.

10. The method according to claim 7, wherein the step of cleaning the wafer with the ozone gas dissolved water is effected by either one of jetting the cleaning water to the wafer and immersing the wafer in the cleaning water.

11. The method according to claim 7, wherein the alkaline solution is an aqueous ammonia/hydrogen peroxide solution.

12. The method according to claim 7, wherein a step of brush cleaning is combined with the step of cleaning with the alkaline solution.

13. A method of treating a wafer comprising: a step of polishing a wafer polishing surface of a wafer while holding a wafer holding surface of the wafer by dripping a polishing agent onto a polishing surface of the wafer opposite the wafer holding surface, the wafer polishing surface being polished while the wafer holding surface is covered with a synthetic resin protective film which has etching resistance against the polishing agent, good adhesion to the wafer and has a property of being easy to peel off the wafer after the wafer is polished; and a step of cleaning the polished wafer to remove the polishing agent and the synthetic resin protective film by cleaning the polished wafer with ozone gas dissolved water and then cleaning the wafer using an alkaline solution.

* * * * *